United States Patent [19]

Gossen, Jr. et al.

[11] Patent Number: 4,883,543

[45] Date of Patent: Nov. 28, 1989

[54] SHIELDING FOR IMPLANT IN MANUFACTURE OF DYNAMIC MEMORY

[75] Inventors: Richard N. Gossen, Jr., Sugarland; William C. Bruncke, Houston; Gordon D. Baker, Lubbock, all of Tex.

[73] Assignee: Texas Instruments Incroporated, Dallas, Tex.

[21] Appl. No.: 156,533

[22] Filed: Jun. 5, 1980

[51] Int. Cl.⁴ .................. H01L 21/265; H01L 21/28
[52] U.S. Cl. .................................. 437/37; 357/41; 357/91; 437/25; 437/52
[58] Field of Search ............... 148/1.5, 187; 29/571, 29/576 B; 357/41, 91

[56] References Cited

U.S. PATENT DOCUMENTS

| | | | |
|---|---|---|---|
| 4,208,781 | 6/1980 | Mohan Rao et al. | 29/276.3 |
| 4,224,733 | 9/1980 | Spadea | 29/571 |
| 4,230,504 | 10/1980 | Kuo | 148/1.5 |
| 4,240,092 | 12/1980 | Kuo | 357/41 |
| 4,240,195 | 12/1980 | Clemens et al. | 29/571 |
| 4,270,262 | 6/1981 | Hori et al. | 29/571 |
| 4,282,646 | 8/1981 | Fortino et al. | 29/571 |
| 4,290,184 | 9/1981 | Kuo | 29/571 |
| 4,305,200 | 12/1981 | Fu et al. | 29/571 |
| 4,317,274 | 3/1982 | Yasunari | 29/571 |
| 4,325,169 | 4/1982 | Ponder et al. | 29/571 |
| 4,326,329 | 4/1982 | McElroy | 29/571 |
| 4,326,331 | 4/1982 | Guterman | 29/571 |
| 4,334,236 | 6/1982 | Hoffmann et al. | 357/59 |
| 4,350,536 | 9/1982 | Nakano et al. | 148/1.5 |
| 4,350,992 | 9/1982 | Tubbs | 357/23 |
| 4,364,167 | 12/1982 | Donley | 29/576 B |
| 4,388,121 | 6/1983 | Mohan Rao | 148/1.5 |

OTHER PUBLICATIONS

Esch IBM-TD13, 21 (1978) 731.
Hsieh et al. IBM-TD13, 23 (1980) 661.

*Primary Examiner*—Upendra Roy
*Attorney, Agent, or Firm*—John G. Graham

[57] ABSTRACT

A method for making semiconductor devices such as dynamic read/write memory cell arrays of the one-transistor N— channel silicon gate type employs an ion implant of high dosage to produce N+ source/drain regions. The transistor and capacitor gates are in place when this implant is performed, and the chain oxide beneath the gates can break down due to static charge produced on the slice surface as a result of the ion implant. To prevent build-up of static charge on the surface, a thin coating of polysilicon is applied before the implant and grounded. This coating is subsequently removed by thermal oxidation or etching. Alternatively, a thermal oxide coating may be used as it will prevent the implanted arsenic from reaching the polysilicon gates, although it will penetrate a thinner thermal oxide coating over the source/drain area. Other dielectric films such as silicon nitride may also be used.

6 Claims, 4 Drawing Sheets

SHIELDING FOR IMPLANT IN MANUFACTURE OF DYNAMIC MEMORY

BACKGROUND OF THE INVENTION

This invention relates to semiconductor memory devices and methods of manufacture, and more particularly to an improved method for making a one-transistor dynamic read/write memory device of the N-channel silicon gate type.

Dynamic read/write memory cells made by the single-level or double-level polysilicon N-channel self-aligned processes commonly used in the industry are shown in U.S. Pat. No. 4,055,444 as well as in pending U.S. Patent applications Ser. No. 648,594, filed Jan. 12, 1976 and Ser. No. 722,841, filed Sept. 13, 1976, by C-K Kuo, all assigned to Texas Instruments; these processes are also known in Electronics: Feb. 19, 1976, pp. 116-121; May 13, 1976, pp 81-86; and Sept. 28, 1978, pp. 109-116.

In typical dynamic RAM cell arrays, the source/drain regions and "bit" lines (Y or column input/output lines) are usually formed of elongated N+ silicon regions. As the cell sizes and device geometries have been "scaled" to produce arrays of higher density, it has become the usual practice to form these N+ regions by an arsenic implant instead of by a phosphorus diffusion as had been previously employed. At the point in the process where the implant is performed polysilicon layers are in place for the transistor gates and capacitor gates. These are floating and are separated from the silicon surface by a thin gate oxide, perhaps 400 Å. One of the most common failure modes in high density dynamic RAMS is that of electrical shorting between the polysilicon and substrate through this gate oxide. At high implant dosages and/or currents as needed for source/drain implants, a static charge builds up on the polysilicon to levels which can break down the gate oxide. This failure mode is reduced by use of thicker gate oxide, or of course by reducing the plant dosage, but these solutions are limited by bar size, N+ resistivity, access time, and other constraints.

It is the principal object of this invention to provide an improved method of making dynamic read/write memory devices of the "scaled" type having thin gate oxide and thin implanted source/drain regions. Another object is to provide a high yield manufacturing method for a dynamic memory cell array of reduced cell size. An additional object is to provide a dense array of DRAM memory cells, made by an improved method which provides a reduction in failures due to shorting through thin oxide.

SUMMARY OF THE INVENTION

In accordance with an illustrative embodiment of the invention, a method for making semiconductor devices such as a dynamic read/write memory cell arrays of the one-transistor N-channel silicon gate type employs an ion implant of high dosage to produce N+ source/-design regions. High beam current levels are also employed for maximum throughput rate in manufacturing. The transistor and capacitor gates are in place when this implant is performed, and the thin oxide beneath the gates can break down due to static charge produced on the slice surface as a result of the ion implant. To prevent build-up of static charge on the gates, a thin coating of polysilicon is applied before the implant and grounded to the slice carrier. Alternatively, a dielectric film such as silicon oxide or silicon nitride may be used.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENTS

Figure 1:
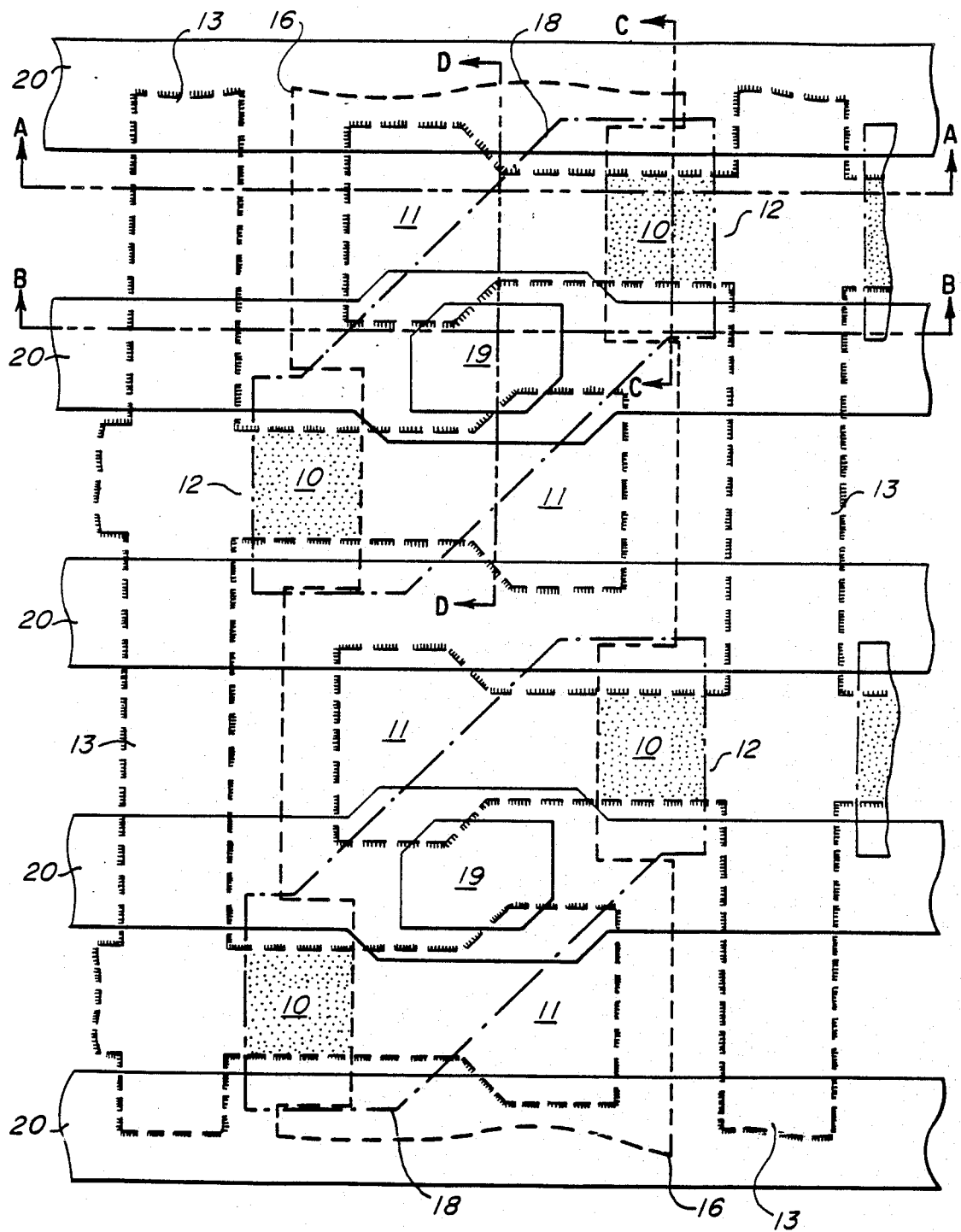
FIG. 1 is a greatly enlarged plan view of a small portion of a semiconductor chip showing the physical layout of a part of a dynamic memory cell array which may be made by the improved process according to the invention.

With reference to FIGS. 1, 2, and 3a-3d, an array of one-transistor dynamic memory cells is illustrated which may be made according to the invention. Each memory cell includes an MOS access transistor 10 and an MOS capacitor 11. Each access transistor has an N+ source (or drain) region 12 which is part of one of a large number of elongated column or bit lines 13 formed by N+ implanted regions in the face of the silicon bar. The capacitors 11 include inverted regions 15 in the surface of the silicon created by a Vcc voltage, about 5v, on first level polycrystalline silicon strips 16 which extend along the columns. The gates 17 of the access transistors 10 are formed by second level polycrystalline silicon segments 18, each of which forms gates for two of the transistors. The segments 18 extend over the first level polyilicon to provide contact areas 19 where connection is made to metal row or word lines 20. Each contact area 19 is shared by two cells. No contact area 19 is seen for alternate ones of the lines 20 in FIG. 1 since contact areas for such lines will be between the next pair of columns.

The first level polysilicon strips 16 are separated from the silicon in the area of the capacitors 15 by a thin thermal oxide coating 21, and a similar silicon oxide coating 22 separates the gates 17 from the silicon at the transistors 10 as well as separating the remainder of the second level poly segments 18 from the first level poly. A thick layer 23 of deposited oxide separates the polysilicon layers from the metal lines 20. A thick layer of thermal silicon oxide 24 surrounds all of the moat areas on the face of the silicon bar; that is, all areas not occupied by the transistors 10, capacitors 11 and bit lines 13 are covered by this field oxide 24. Channel stop regions 25 underlie all of the field oxide.

According to the primary feature of the invention, the ion implant which creates the N+ regions 12 and 13 is performed under conditions which will greatly reduce thin oxide failure problems which have previously plagued dynamic memory devices of this type, as explained below in more detail.

Figure 2:
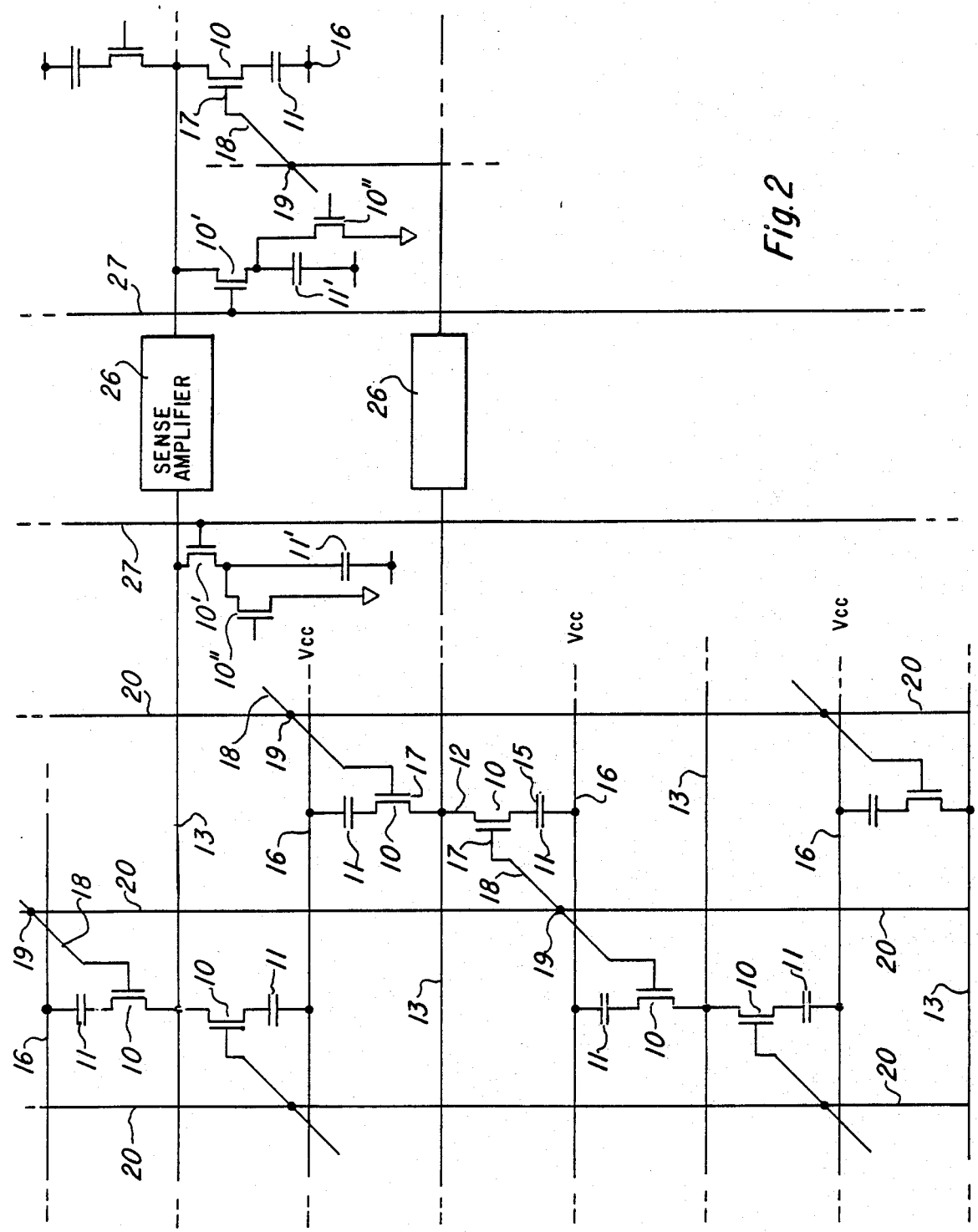
FIG. 2 is an electrical schematic diagram of the part of the cell array of FIG. 1.
Figure 3A:
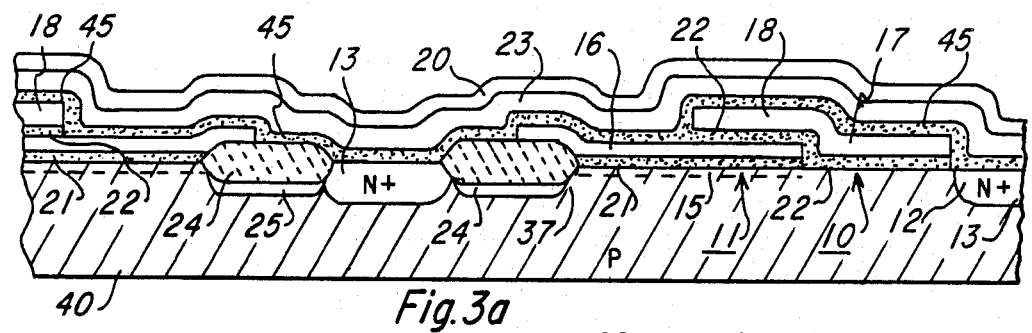
FIGS. 3a-3d are elevation views in section of the cells of FIG. 1, taken along the lines a—a, b—b, c—c, and d—d, respectively.
Figure 3B:
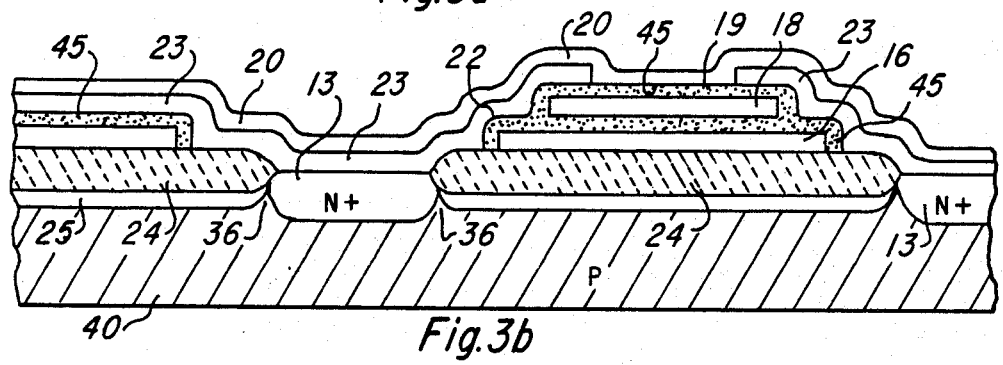
Figure 3C:
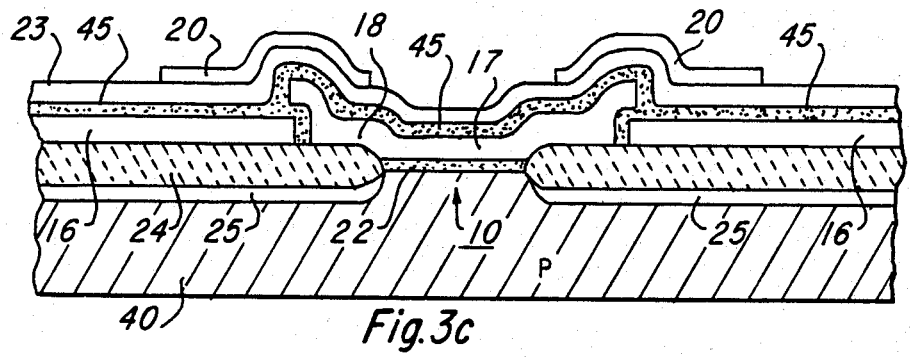
Figure 3D:
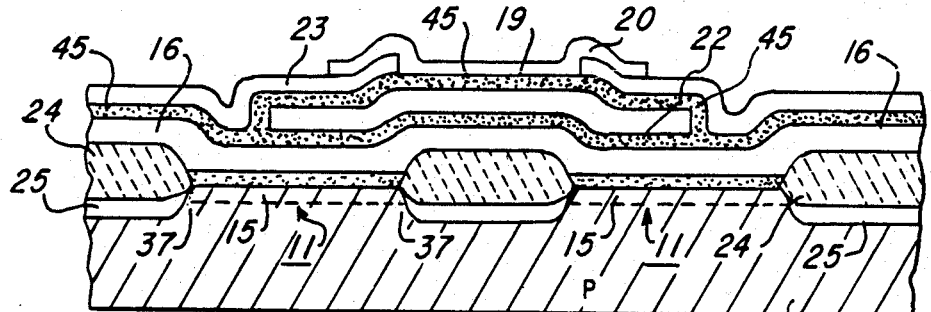

The cell array, of which FIG. 1 is a very small part, would typically contain perhaps 64K cells on a silicon bar which is about 160 mils on a side or about 25,000 sq. mil area, depending upon the bit density. The four cells shown would be on a minute part of the bar, perhaps one or two mils wide. A 64K RAM would require 256 of the X address lines or row lines 20, and 256 of the bit or Y lines 13, providing 65,536 bits. As seen in FIG. 2, each of the bit lines 13 is split into halves which are connected to opposite sides of a differential sense amplifier 26. A dummy cell with an access transistor 10', a capacitor 11' and a discharge transistor 10" is provided on each side of each sense amplifier; when a cell on one side is addressed by a word line 20, a dummy cell address line 27 on the opposite side is activated. This cell array and sense amplifier is shown in Electronics, Sept. 28, 1978, pp. 109–116 and copending application Ser. No. 944,822, filed Sept. 22, 1978, now U.S. patent, by McAlexander, White and Rao, assigned to Texas Instruments.

Turning now to FIGS. 4a–4d, a process for making the DRAM cell array according to the invention will be described. The starting material is a slice of P-type monocrystalline silicon, typically four inches in diameter and twenty mils thick, cut on the <100> plane, of suitable resistivity. As mentioned above, in the FIGURES the portion shown of the bar 40 represents only a very small part of the slice, perhaps one or two mils wide. After appropriate cleaning, the slice is oxidized by exposing to oxygen in a furnace at an elevated temperature of perhaps 1100° C. to produce an oxide layer 41 over the entire slice of a thickness of about 1000 Å. Next, a layer 42 of silicon nitride of about 1000 Å thickness is formed over the entire slice by exposing to an atmosphere of dichlorosilane and ammonia in a reactor. A coating of photoresist is applied to the entire top surface of the slice, then exposed to ultraviolet light through a mask which defines the desired pattern of the thick field oxide 24 and the P+ channel stops 25. The resist is developed, leaving areas where nitride is then removed by etching the exposed part of the nitride layer 42 but leaving in place the oxide layer 41.

Using photoresist and nitride as a mask, the slice is subjected to an implant step to produce the channel stop regions; to this end boron atoms are introduced by ion implant into unmasked regions 43 of silicon. The regions 43 will not exist in the same form in the finished device, because silicon will be consumed in the field oxidation procedure. Usually the slice is subjected to a heat treatment after the boron implant but prior to field oxide growth, as set forth in U.S. Pat. No. 4,055,444 of G. R. Mohan Rao, assigned to Texas Instruments.

Figure 4A:
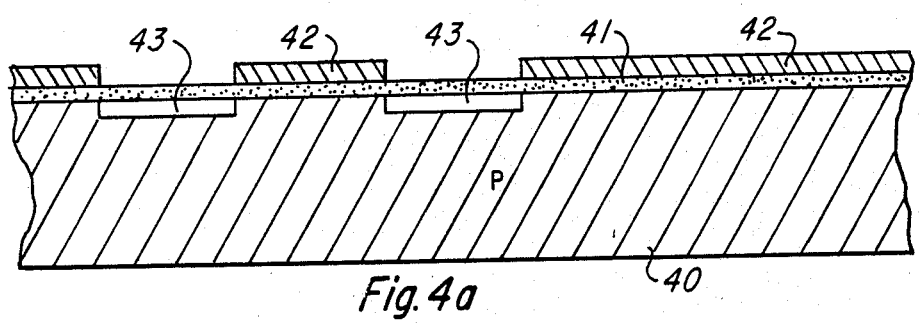
FIGS. 4a-4d are elevation views in section of the cell array of FIGS. 1 and 3a-3d, at successive stages in the manufacturing process, taken generally along the line a—a in FIG. 1.
Figure 4B:
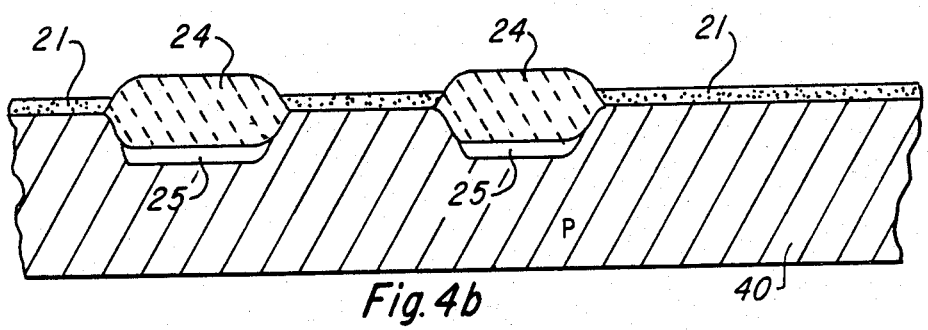

The next step in the process is the formation of field oxide 24 by subjecting the slices to steam or an oxidizing atmosphere at about 900° to 1000° C. for several hours. This causes a thick field oxide layer 24 to be grown as seen in FIG. 4b, into the silicon surface as silicon is consumed upon oxidation. The remaining parts of the nitride layer 42 mask oxidation. The thickness of this layer 24 is about 10000 Å, part of which is above the original surface and part below. The boron doped P+ regions 43 formed by implant are partly consumed, but also diffuse further into the silicon ahead of the oxidation front to produce reduced concentration P+ field stop regions 25 which are much deeper than the original regions 43.

Next the remaining nitride layer 42 is removed by an etchant which attacks nitride but not silicon oxide, then the oxide 41 is removed by etching and the exposed silicon cleaned. The first silicon oxide 21 is grown by thermal oxidation to a thickness of about 400 Å. In areas of the slice where depletion load devices are required, although not pertinent to this invention, a masked ion implant step would be done at this point. Likewise, the threshold voltage of the enhancement mode transistors in the cell array or in the periphery may be adjusted by another ion implant. These implants are at a low d sage so the static charge build-up mentioned herein is of no concern.

Figure 4C:
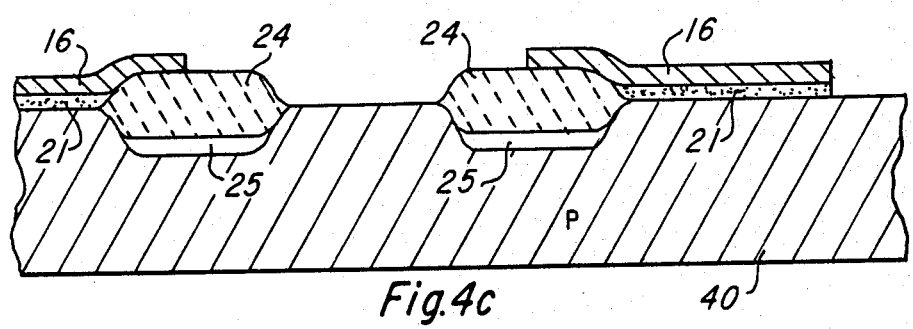

As seen in FIG. 4c, a first layer of polycrystalline silicon is deposited over the entire slice in a reactor using standard techniques to a thickness of about 4000 Å. This layer is doped with phosphorus by an N+ deposition to make it highly conductive. This first level polysilicon layer is patterned by applying a layer of photoresist, exposing to ultraviolet light through a mask prepared for this purpose, developing, then etching the exposed polysilicon to define the capacitor gates or strips 16 in the cell array.

Figure 4D:
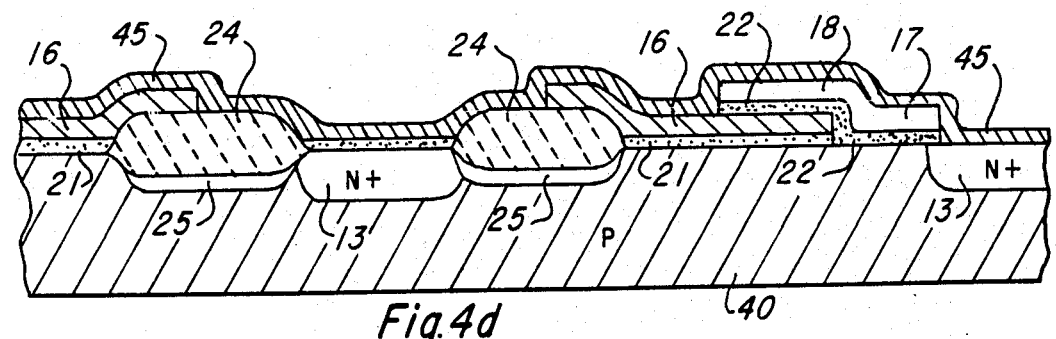

The upper surface of the first level polysilicon as well as exposed silicon is oxidized by exposing the slice to an oxidizing atmosphere at 900° to 1000° C. to create the second thin thermal oxide layer 22 over the channels of the transistors 10 and over the capacitor gates 16 to a thickness of about 400 Å. A second level of polycrystalline silicon is next deposited over the slice using standard techniques, masked by photoresist and etched to leave the segments 18 which also form the transistor gates 17. As seen in FIG. 4d, the slice is now ready for the high dosage arsenic implant which creates the N+ regions 12 and 13.

Prior to this arsenic implant, according to the invention, a thin 200 Å coating of polycrystalline silicon 45 is deposited over the face of the slice on top of the polysilicon gates 16 and 17. This layer is grounded by the fixture which holds the slice in the implant equipment. Since no oxide separates the polysilicon layer 45 from the polysilicon gates 16 and 17, the layer 45 is also shorted to these gates and to the substrate 40 at the areas where the regions 13 are to be formed. Static charge which would tend to build up is therefore dissipated to ground, so the thin oxide is protected. The arsenic implant is performed at a dosage in the order of $10^{16}$ ions/cm$^2$, masked by the polysilicon gates 16 and 17. The polysilicon coating 45 is removed either by thermal oxidation or by an etch step prior to depositing the multilevel oxide 23. The thickness of the layer 45 is limited so that it does not impede or mask the arsenic implant, and also so that it is readily removed preferably by oxidation or otherwise by etching. The oxidation step for the layer 45 is at a moderate temperature, 800°–950° C. and it will also serve to activate the implanted arsenic atoms.

Referring to FIGS. 1 and 3a–3d, a thick layer 23 of silicon oxide is next deposited by decomposition of silane at a low temperature, about 400° C. This layer 23 insulates the metal level from the layers of polycrystalline silicon, and is referred to as multilevel oxide. The multilevel oxide layer 23 is patterned by a photoresist operation, exposing the contact areas 19 for metal-to-polysilicon contacts along the bit lines 20 in the cell array (and contact areas for a metal-to-silicon or metal-to-poly contact for peripheral devices). Metal contacts and interconnections are used in the periphery of the chip in the input buffers, decoders, sense amplifiers, and the like, as well as for the bonding pads which provide connection to external electrodes. The metal contacts and interconnections are made in the usual manner by depositing a thin film of aluminum over the entire top surface of the slice then patterning it by a photoresist mask and etch sequence. This leaves the metal strips 20.

In another embodiment of the invention, the coating 45 applied before the arsenic implant is thermal oxide instead of polycrystalline silicon. The slice is subjected to a thermal oxidation step to produce oxide 45 of about 500 Å over the bar original silicon in the areas where N+ regions 13 are to be formed, while at the same time the oxide 45 grows to about 1500 Å over the polysilicon 16, 17, 18. The higher growth rate of thermal oxide on polycrystalline silicon compared to single crystalline silicon is due to the less dense surface structure; more sites for combination of silicon and oxygen are available. This step may be at 950 C. in oxygen for ½ hour, for example. An arsenic implant at 150 KeV at a dosage of $1 \times 10^{16}$ is then performed. At this level, the depth of penetration is about 800 Å so arsenic will penetrate at high concentration to the silicon surface through 500 Å oxide, but little will reach the polysilicon through 1500 Å oxide so there will be negligible charge build up. A high temperature drive-in step then produces the heavily doped N+ regions 13. In this embodiment there is no need to remove the layer 45. As another alternative, silicon nitride or other dielectric may be used instead of the silicon oxide film 45.

A thick protective oxide layer (not shown) covers the metallization, with aperatures etched in this layer above bonding pads. This layer is non-thermal oxide, deposited at low temperature in accord with standard MOS manufacturing methods. Usually this covers everything except the bonding pads on a bar.

While this invention has been described with reference to an illustrative embodiment, this description is not intended to be construed in a limiting sense. Various modifications of the illustrative embodiment, as well as those embodiments of the invention, will be apparent to persons skilled in the art upon reference to this description. It is therefore contemplated that the appended claims will cover any such modifications or embodiments as fall within the true scope of the invention.

What is claimed is:

1. A method of making a semiconductor device such as an array of memory cells of the one-transistor type, comprising the step of:
    applying conductive areas such as transistor gates and capacitor gates to a face of a semiconductor body separated from the face by a thin dielectric, wherein the body is P-type silicon, and the conductive areas include conductive material which is polycrystalline silicon,
    coating said entire face with a thin layer of insulating material which acts as a shield against electrostatic build-up on said conductive areas,
    subjecting said face to an ion implant to create heavily doped N+ semiconductor regions in said face, wherein said implant is arsenic,
    wherein said step of coating includes thermal oxidation, the thickness of the coating being much greater over said polycrystalline silicon than over exposed single crystal silicon.

2. A method according to claim 1 wherein said ion implant does not penetrate the insulating coating over said polycrystalline silicon.

3. A method according to claim 1 wherein the step of applying conductive areas include:
    applying a second layer of conductive material on said face partially overlying the first layer and insulated therefrom, and overlying a second semiconductor region.

4. A method according to claim 3 wherein the second layer is patterned to define isolated conductor segments which are electrically floating.

5. A method according to claim 4 wherein the first layer is patterned to define an elongated gate for a plurality of capacitors.

6. A method of making a semiconductor device comprising the steps of:
    coating an entire face of a semiconductor body with a thin layer of shield material,
    subjecting said face to a high dosage ion implant which penetrates said layer in some selected areas to form regions in said face and which does not penetrate said layer in other selected areas, wherein a conductive layer of polycrystalline silicon has been previously applied to said other selected areas,
    wherein the step of coating with shield material creates a barrier to build-up electrostatic charge on said conductive layer during said ion implant and includes subsequently thermally oxidizing the layer and the surface above said regions, and
    wherein the step of coating includes forming thicker oxide on the polycrystalline silicon than on exposed single crystal silicon.

* * * * *